United States Patent
Matsubara (10) Patent No.: US 7,751,998 B2
(45) Date of Patent: Jul. 6, 2010

(54) SEMICONDUCTOR DEVICE, METHOD FOR MEASURING CHARACTERISTICS OF ELEMENT TO BE MEASURED, AND CHARACTERISTIC MANAGEMENT SYSTEM OF SEMICONDUCTOR DEVICE

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 195 days.

(21) Appl. No.: 11/898,551

(22) Filed: Sep. 13, 2007

(65) Prior Publication Data

US 2008/0068037 A1 Mar. 20, 2008

(30) Foreign Application Priority Data

Sep. 20, 2006 (JP) .............. 2006-253941

(51) Int. Cl.
*G01N 37/00* (2006.01)

(52) U.S. Cl. .......................... 702/82; 257/48

(58) Field of Classification Search ............ 702/60, 702/81, 82, 84
See application file for complete search history.

(56) References Cited

U.S. PATENT DOCUMENTS

| | | | | |
|---|---|---|---|---|
| 4,961,053 A | * | 10/1990 | Krug | 324/537 |
| 5,053,700 A | * | 10/1991 | Parrish | 324/537 |
| 6,492,831 B2 | * | 12/2002 | Hashimoto | 324/765 |
| 6,614,252 B2 | * | 9/2003 | Takeuchi | 324/765 |
| 7,236,905 B2 | * | 6/2007 | Kodera | 702/124 |
| 2003/0213953 A1 | * | 11/2003 | Sohn et al. | 257/48 |
| 2005/0194987 A1 | * | 9/2005 | Yang et al. | 324/765 |

FOREIGN PATENT DOCUMENTS

| | | |
|---|---|---|
| JP | 02-116140 | 4/1990 |
| JP | 06-138189 | 5/1994 |
| JP | 9-186565 | 7/1997 |
| JP | 10-115672 | 5/1998 |
| JP | 11-340806 | 12/1999 |
| JP | 2000-124272 | 4/2000 |
| JP | 2000-314761 | 11/2000 |
| JP | 2003-043099 | 2/2003 |
| JP | 2004-171730 | 6/2004 |

* cited by examiner

*Primary Examiner*—Eliseo Ramos Feliciano
*Assistant Examiner*—Ronald L Biegel
(74) *Attorney, Agent, or Firm*—Young & Thompson (57) ABSTRACT

A plurality of series circuits each consisting of a current-carrying element and an element to be measured are provided between a power supply potential VDD and a ground potential VSS. The current-carrying elements are supplied with a test signal commonly, and corresponding selection signals, respectively. After a mode is set so that power consumption of a main circuit unit included in a semiconductor device is substantially zero or almost constant, the elements to be measured are energized sequentially and, in this state, a power supply current that flows through the semiconductor device is measured sequentially. Accordingly, it is possible to accurately know the power consumption of the element to be measured and it is also possible to know the characteristics of the element to be measured based thereon.

6 Claims, 6 Drawing Sheets

SEMICONDUCTOR DEVICE, METHOD FOR MEASURING CHARACTERISTICS OF ELEMENT TO BE MEASURED, AND CHARACTERISTIC MANAGEMENT SYSTEM OF SEMICONDUCTOR DEVICE

TECHNICAL FIELD

The present invention relates to a semiconductor device capable of accurately grasping characteristic variations of an element depending on process conditions or the like. The present invention also relates to a method for measuring the characteristics of an element to be measured provided in a semiconductor device in order to grasp characteristic variations. The present invention also relates to a characteristic management system of a semiconductor device capable of making a database of characteristic variations.

BACKGROUND OF THE INVENTION

The characteristics such as a threshold value of an element, such as a transistor, included in a semiconductor device often vary depending on process conditions. Such characteristic variations may occur not only between lots but also in the same wafer, and to know its trend gives essential data to enhance yield of products.

As a method for grasping characteristic variations of an element, a method is known for providing a plurality of TEGs (Test Element Groups) on a wafer. Since the TEGs are arranged normally on a scribe line of a wafer, they do not remain on the chip after dicing. Due to this, an increase in the area of the chip does not occur due to the TEGs.

Figure 6:
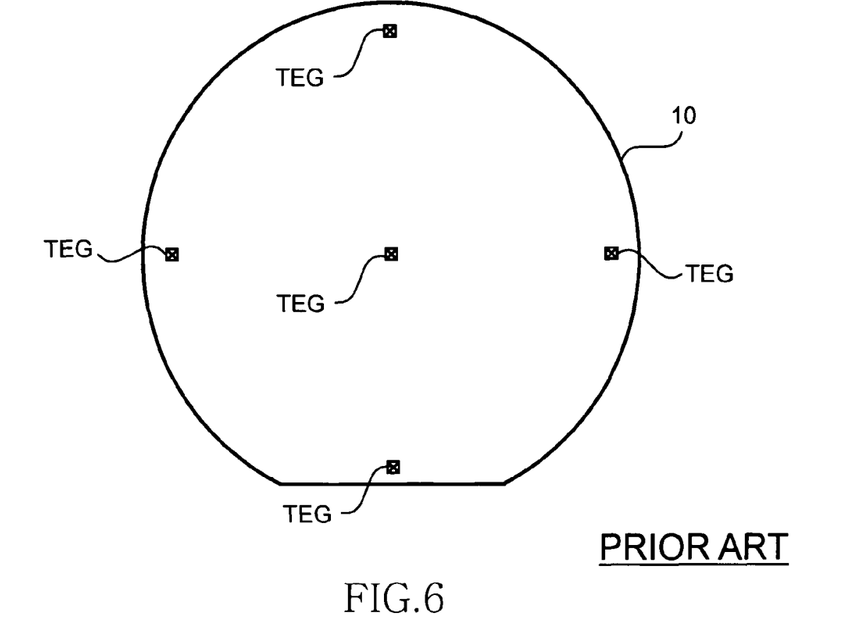
FIG. 6 is a schematic diagram showing an exemplary arrangement of the TEGs on a wafer.

FIG. 6 is a schematic diagram showing an exemplary arrangement of the TEGs on a wafer.

Figure 7:
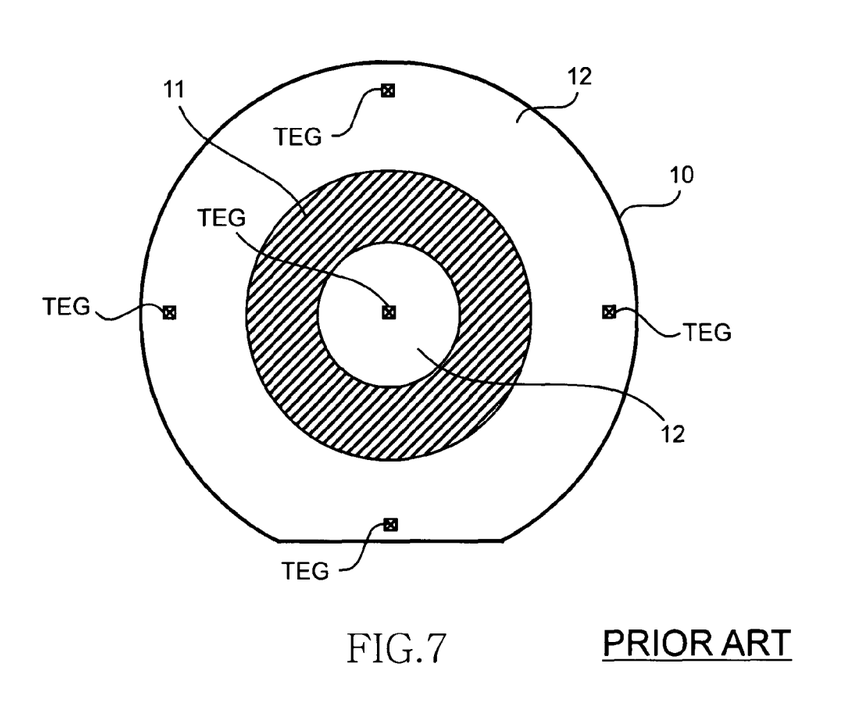
FIG. 7 shows an example that characteristic variations in the plane of the wafer have doughnut-shaped1.

In the example shown in FIG. 6, the TEGs are arranged at five positions of a wafer 10. More specifically, one of them is arranged approximately at the center of the wafer 10 and the others are arranged at the upper, lower, left-hand, and right-hand positions, respectively. The reason that the TEGs are arranged dispersedly in such a manner is to grasp the characteristic variations in the plane of the wafer 10. There are, however, various patterns of variations in the plane of the wafer 10 and, for example, the pattern can be doughnut-shaped as shown in FIG. 7. In FIG. 7, the threshold value of a transistor is high in a region 11, and the threshold value of a transistor is low in a region 12.

Consequently, when variations in the plane shown in FIG. 7 occur, the variations cannot be grasped by the five TEGs. In other words, in the example shown in FIG. 7, all of the five TEGs are located in the region 12 having a low threshold value and therefore the presence of the doughnut-shaped region 11 having a high threshold value cannot be recognized. One solution to this is to increase the number of arranged TEGs, while a problem arises in this case that it takes a long time to measure the TEGs. In addition, jigs for measurement will become more complex.

Further, as described above, since the TEGs are arranged on the scribe line of the wafer, there is a problem that the measurement is not available after dicing has been performed. These problems are solved by providing the TEG for each chip in the wafer. However, since the TEG requires a dedicated measuring pad, the chip area will increase considerably if the TEG is provided for each chip.

As conventional technologies relating to testing of a semiconductor device, technologies described in Japanese Patent Application Laid-opens Nos. H09-186565, H10-115672, H11-340806, and 2004-171730 are known.

SUMMARY OF THE INVENTION

The present invention has been achieved to solve the above problems, and therefore an object of the present invention is to provide a semiconductor device capable of accurately grasping the characteristic variations of an element depending on process conditions or the like, while keeping to a minimum an increase in the chip area.

Another object of the present invention is to provide a semiconductor device capable of measuring the characteristics of an element to be measured even after dicing.

Still another object of the present invention is to provide a method for measuring the characteristics of an element to be measured provided in such a semiconductor device.

Still another object of the present invention is to provide a characteristic management system of such a semiconductor device.

A semiconductor device according to the present invention, comprising: a main circuit unit; a test unit that includes at least one element to be measured; and a controller that energizes the element to be measured in a state in which power consumption of the main circuit unit is kept substantially at zero or almost constant.

A method for measuring characteristics of an element to be measured provided in a semiconductor device according to the present invention, comprising: a first step for setting a mode so that power consumption of a main circuit unit included in the semiconductor device is kept substantially at zero or almost constant; and a second step for measuring a power supply current that flows through the semiconductor device in a state in which the element to be measured is energized.

According to the present invention, since the element to be measured is energized in a state in which the power consumption of the main circuit unit is kept substantially at zero or almost constant, it is possible to accurately know the power consumption of the element to be measured. The power consumption of the element to be measured is linked with the characteristics of the element to be measured, such as the threshold value of a transistor, and therefore, it is possible to know the characteristics of the element to be measured based thereon. To keep the power consumption of the main circuit unit substantially at zero, it is only required to stop power supply to the main circuit unit. To keep the power consumption of the main circuit unit almost constant, it is only required to bring the main circuit unit into a standby state.

A characteristic management system of a semiconductor device according to the present invention, comprising: a measurement unit that performs the method for measuring the characteristics of the element to be measured; an ID acquisition unit that acquires identification data of the semiconductor device; and a database that stores the acquired identification data and a measurement result corresponding to the semiconductor device being associated with each other.

As described above, according to the present invention, since the element to be measured is energized in a state in which the power consumption of the main circuit unit is kept substantially at zero or almost constant, it is possible to accurately know the power consumption of the element to be measured. The power consumption of the element to be measured is linked with the characteristics of the element to be measured, such as the threshold value of a transistor, and therefore it is possible to know the characteristics of the element to be measured based thereon.

According to the present invention, the test unit is built in the semiconductor device and the measurement can be made by activating the test mode, and therefore measurement data for each semiconductor device can be obtained. Accordingly, the distribution of variations in the plane on the wafer can be grasped more accurately compared to the case where the TEGs are used. Further, it is advantageous in that the measurement is possible even after dicing.

As described above, according to the present invention, since the distribution of variations in the plane on the wafer can be accurately grasped, when a database of the distribution is made, the database can be used as crucial data for enhancing yield of products.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
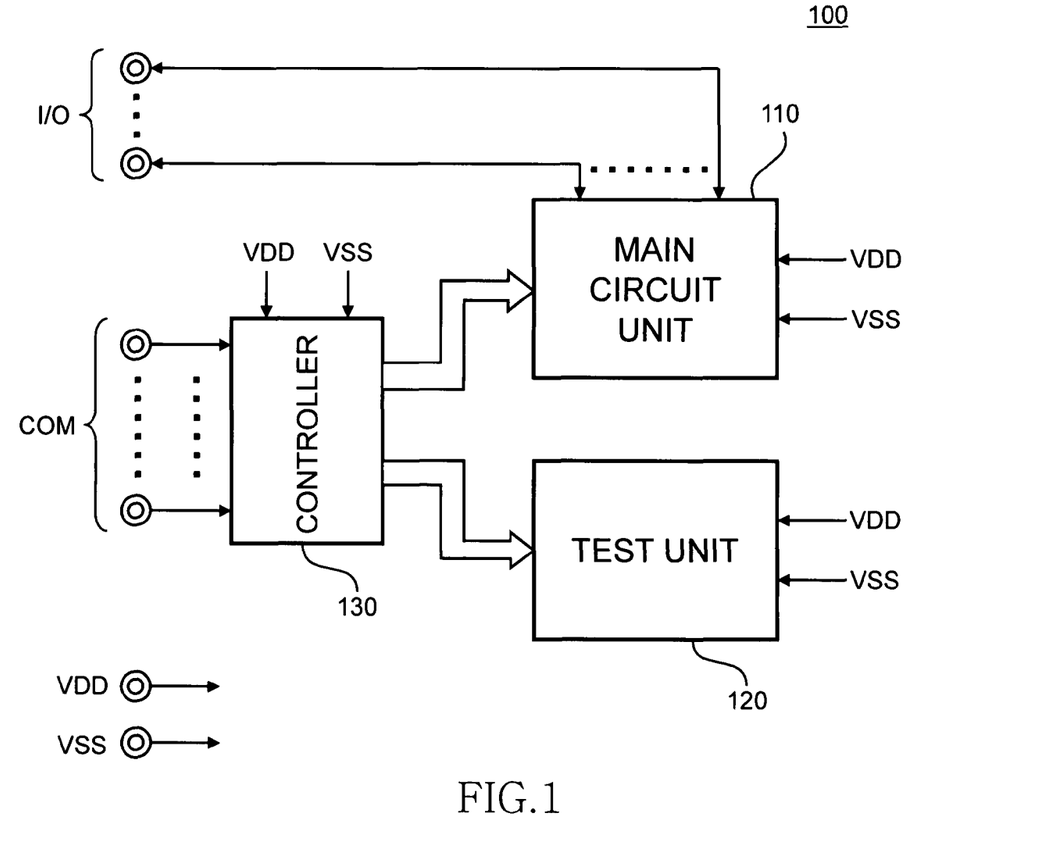
FIG. 1 is a block diagram showing a configuration of a semiconductor device according to a first embodiment of the present invention.

FIG. 1 is a block diagram showing a configuration of a semiconductor device 100 according to a first embodiment of the present invention.

As shown in FIG. 1, the semiconductor device 100 according to the present embodiment includes a main circuit unit 110, a test unit 120, and a controller 130. The main circuit unit 110 is a circuit group for achieving the primary functions of the semiconductor device 100 and connected to a data input/output terminal I/O. Input data supplied to the main circuit unit 110 via the data input/output terminal I/O is subjected to predetermined processing (operation, storage, etc.) in the main circuit unit 110. The result of the processing in the main circuit unit 110 is output via the data input/output terminal I/O. For example, when the semiconductor device 100 according to the present embodiment is a DRAM (Dynamic Random Access Memory), most of the main circuits necessary to achieve the function of the DRAM are included therein.

The test unit 120 is a circuit block including a plurality of elements to be measured, and is activated when the test mode is entered. The test mode is entered by issuance of a predetermined command signal via a command terminal COM. As shown in FIG. 1, a command supplied via the command terminal COM is supplied to the controller 130. The controller 130 decodes the command supplied via the command terminal COM and controls the main circuit unit 110 and the test unit 120 based thereon.

As shown in FIG. 1, all of the main circuit unit 110, the test unit 120, and the controller 130 are supplied with a power supply potential VDD and a ground potential VSS via a common power supply terminal.

Figure 2:
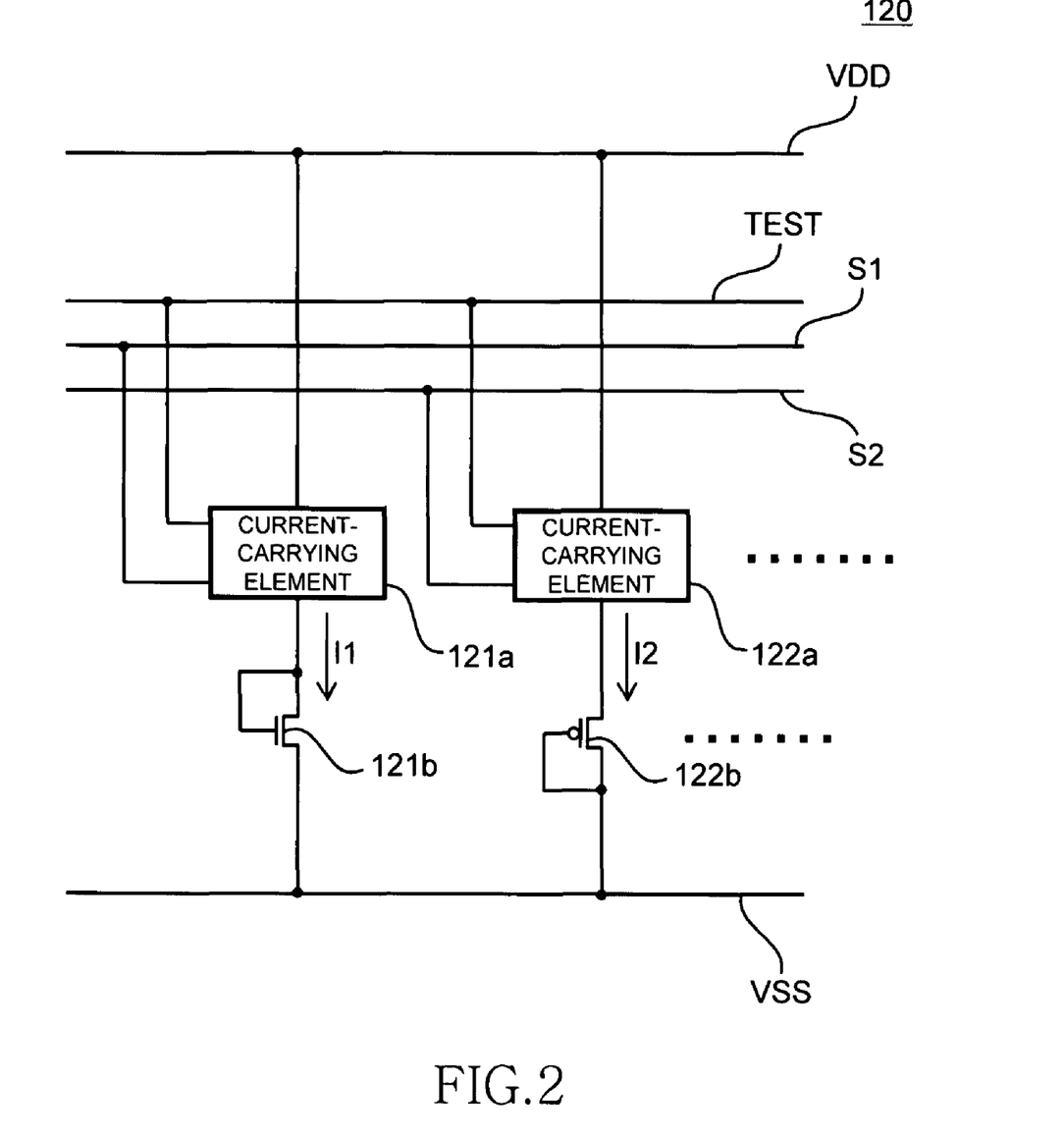
FIG. 2 is a circuit diagram of a test unit.

FIG. 2 is a circuit diagram of the test unit 120.

As shown in FIG. 2, the test unit 120 is provided with a plurality of series circuits consisting of current-carrying elements 121a, 122a, . . . , and elements to be measured 121b, 122b, . . . , respectively (only two are shown in FIG. 2). All of these series circuits are connected between the power supply potential VDD and the ground potential VSS. The current-carrying elements 121a, 122a, . . . , are supplied commonly with a test signal TEST and also supplied with corresponding selection signals S1, S2, . . . , respectively. Due to this, each of the current-carrying elements 121a, 122a, . . . , is brought into conduction state when the test signal TEST and the corresponding selection signals S1, S2, . . . , are activated. Otherwise, they are kept in a nonconductive state.

The test signal TEST and the selection signals S1, S2, . . . , are generated by the controller 130 shown in FIG. 1. The controller 130 can selectively bring the plurality of elements to be measured 121b, 122b, . . . , into a conductive state.

In the present embodiment, the elements to be measured 121b, 122b, . . . , are composed of transistors of different kinds from each another. For example, the element to be measured 121b is composed of a diode-connected N-channel MOS transistor and the element to be measured 122b is composed of a diode-connected P-channel MOS transistor. As transistors constituting the elements to be measured 121b, 122b, . . . , it is desirable to prepare not only transistors of different conduction types but also all kinds of transistors included in the main circuit unit 110, such as transistors whose thicknesses of gate oxide film are different, and transistors whose impurity concentrations are different.

A method for measuring the characteristics of an element to be measured according to the present embodiment is explained next.

Figure 3:
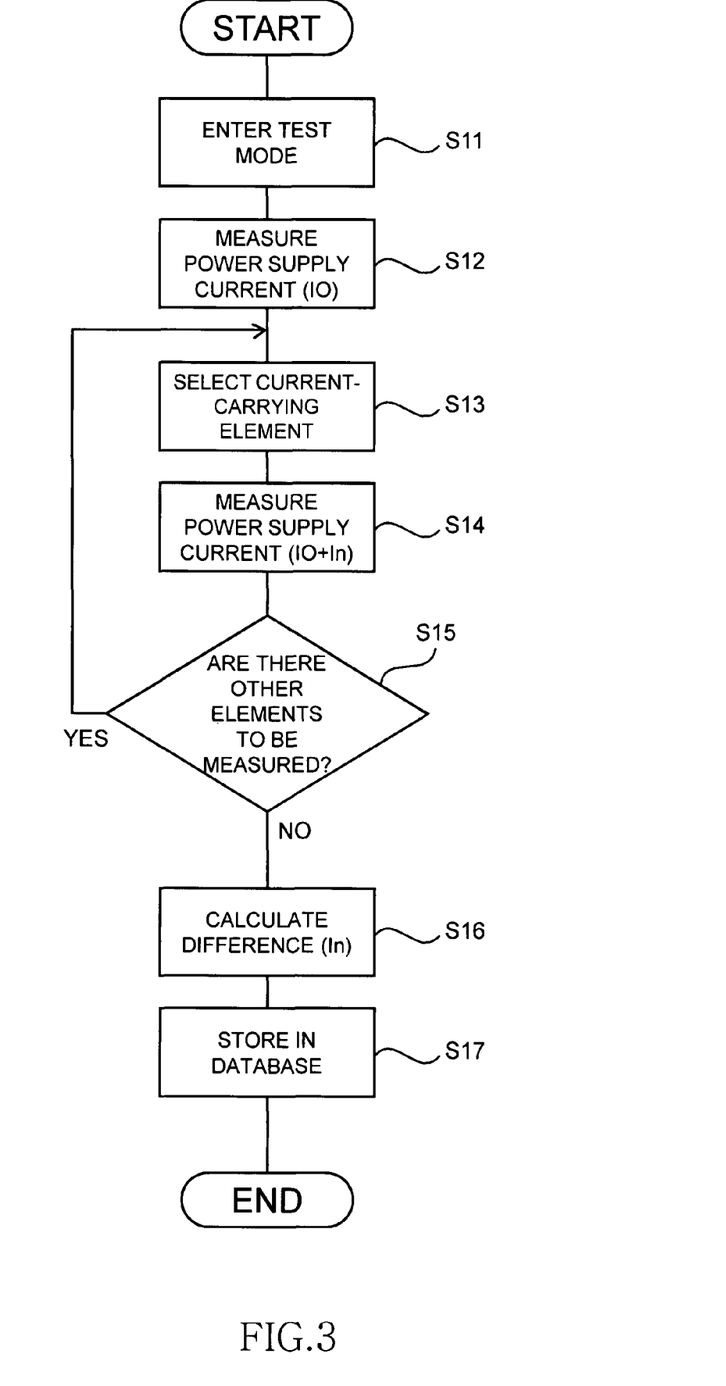
FIG. 3 is a flowchart for explaining the method for measuring the characteristics of an element to be measured according to a preferred embodiment of the present invention.

FIG. 3 is a flowchart for explaining the method for measuring the characteristics of an element to be measured according to this embodiment.

Figure 4:
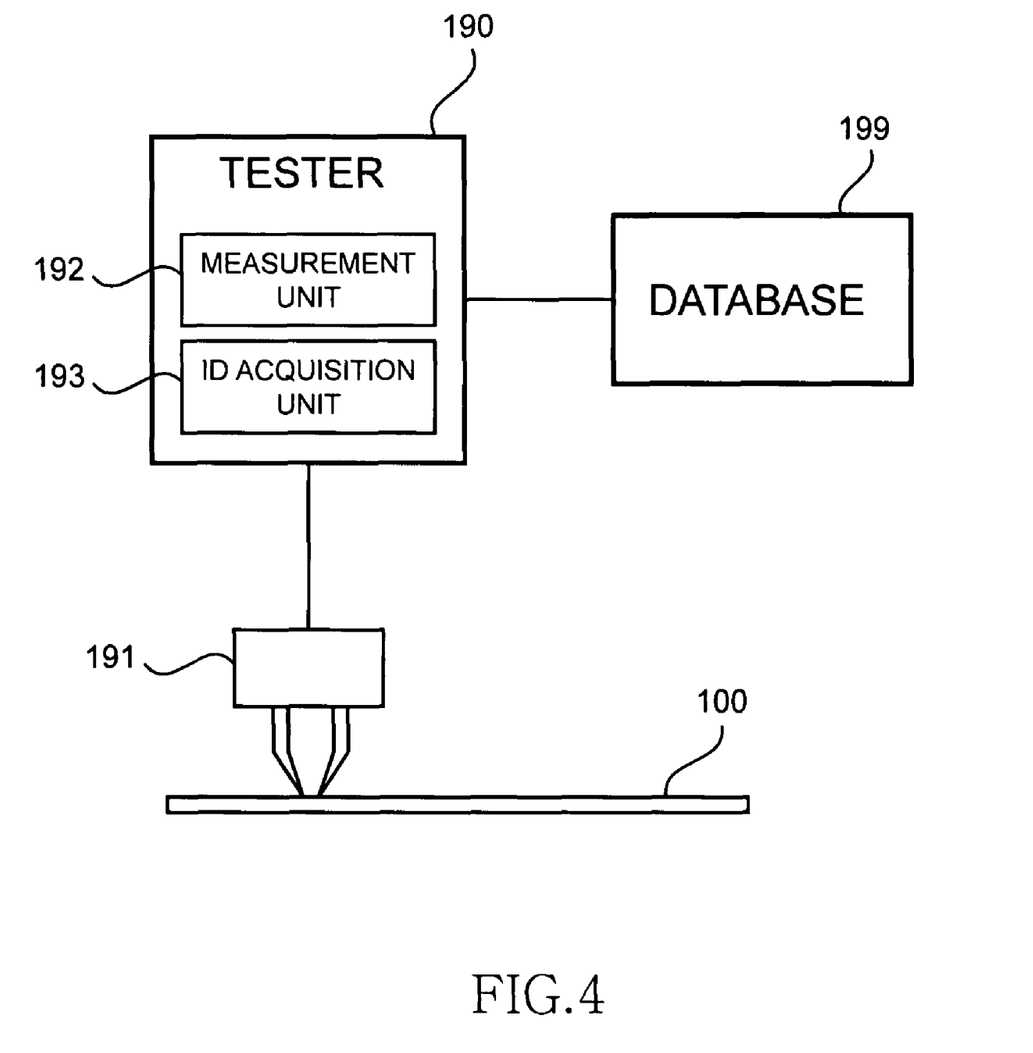
FIG. 4 is a schematic diagram of a characteristic management system.

When the characteristics of an element are measured, first, the test mode is entered in order to bring the main circuit unit 110 into a standby state as shown in FIG. 3 (step S11). This can be performed by issuing a predetermined command signal while keeping a probe 191 in contact with the command terminal COM using a tester 190 as a component element of a characteristic management system as shown in FIG. 4.

In this manner, the controller 130 brings the main circuit unit 110 into a standby state and keeps the power consumption of the main circuit unit 110 at a very small constant value. For example, when the semiconductor device 100 according to the present embodiment is a DRAM, it is preferable to enter a deep power-down mode. When the DRAM enters the deep power-down mode, the power consumption in the main circuit unit 110 is only an almost constant leak current.

Next, using a measurement unit 192 provided to the tester 190, a power supply current I0 that flows through the semiconductor device 100 is measured (step S12). At this time, since the main circuit unit 110 is in the standby state, the power supply current I0 to be measured is a so-called initial current and is equal to the almost constant leak current described above. To be precise, due to the presence of the power consumption in the controller 130, the initial current I0 to be measured includes a slight current that flows through the controller 130.

Next, using the controller 130, one of the current-carrying elements 121a, 122a, . . . , is selected so that current flows through one of the elements to be measured 121*b*, 122*b*, . . . (step S13). As described above, the selection of a current-carrying element can be made by activating the test signal TEST and the corresponding selection signals S1, S2, . . . . As a result, in the semiconductor device 100, the energized element is only the selected element to be measured.

In this state, using the measurement unit 192 provided to the tester 190, the power supply current that flows through the semiconductor device 100 is measured again (step S14). The power supply current to be measured must be the sum (=I0+In) of the current value I0 obtained in step S12 and a current value In (=I1, I2, . . . )that flows through the selected element to be measured.

The plurality of elements to be measured are sequentially subjected to such processing and when the measurement of all of the elements to be measured is completed (step S15: NO), the difference between the respective current values (=I0+In) obtained in step S14 and the current value (=I0) obtained in step S12 is calculated (step S16).

As described above, the power supply current (=I0+In) measured in step S14 is the sum of the current value I0 obtained in step S12 and the current value In that flows through the selected element to be measured, and therefore, such an operation allows to extract only the amount of a current In that flows through the element to be measured. In other words, although the main circuit unit 110 and the test unit 120 are supplied with the power supply voltage via the same power supply terminal, it is possible to extract only the amount of the current In that flows through the selected element to be measured.

To be precise, the power supply current measured in step S14 also includes a slight current that flows through the controller 130. Because of this, the current component of the controller 130 mixed in step S12 is canceled out by the above operation. The calculation of the amount of the current In can be made for each measurement of each element to be measured (step S14) instead of being made altogether as in the flow chart shown in FIG. 3.

The calculated current values I1, I2, . . . , are stored in a database 199 shown in FIG. 4 (step S17). The database 199 is a component element of the characteristic management system. The storing into the database 199 is done associated with identification data (ID) of the semiconductor device 100 read by an ID acquisition unit 193. The ID includes at least a lot number, a product number, and the like. However, it is preferable to further include information about the position of the semiconductor device on the wafer.

A measurements process is completed as described above. The current values I1, I2, . . . , thus obtained are linked accurately with the threshold voltage of the elements to be measured 121*b*, 122*b*, . . . . Because of this, the threshold voltage of the elements to be measured 121*b*, 122*b*, . . . , can be accurately known by analyzing the current values I1, I2, . . . . Consequently, when all kinds of the transistors included in the main circuit unit 110 are prepared as the transistors constituting the elements to be measured 121*b*, 122*b*, . . . , the threshold voltage of all kinds of transistors included in the main circuit unit 110 can be grasped. The result of the measurement of the threshold value can be used for correction of the internal power supply of the semiconductor device 100 or the like.

As described above, according to the present embodiment, by causing the main circuit unit 110 to enter the standby mode, the power consumption of the main circuit unit 110 is kept almost constant and the measurement of the element to be measured is done in this state. Therefore, it is possible to accurately measure the amount of a current that flows through the element to be measured. In addition, the measurement is made possible by incorporating the elements to be measured in the chip itself, instead of using the TEGs provided conventionally outside the chip, and by activating the test mode. Therefore, the characteristics of each chip can be grasped. In particular, when information about the position on the wafer is included in the ID, the variations in the plane of the wafer can be grasped quite accurately.

Since a dedicated measurement pad is not necessary unlike in the case of TEG, an increase in the chip area is considerably small. In addition, since a dedicated jig for conducting the test is not necessary and the device for the selection test can be used as it is, the test can be conducted at high speed and at a low cost. Although it is preferable to make the characteristic measurement of the element to be measured in a wafer state using the device for the selection test, the present invention is not limited to this, but also the test can be performed after dicing or packaging.

Figure 5:
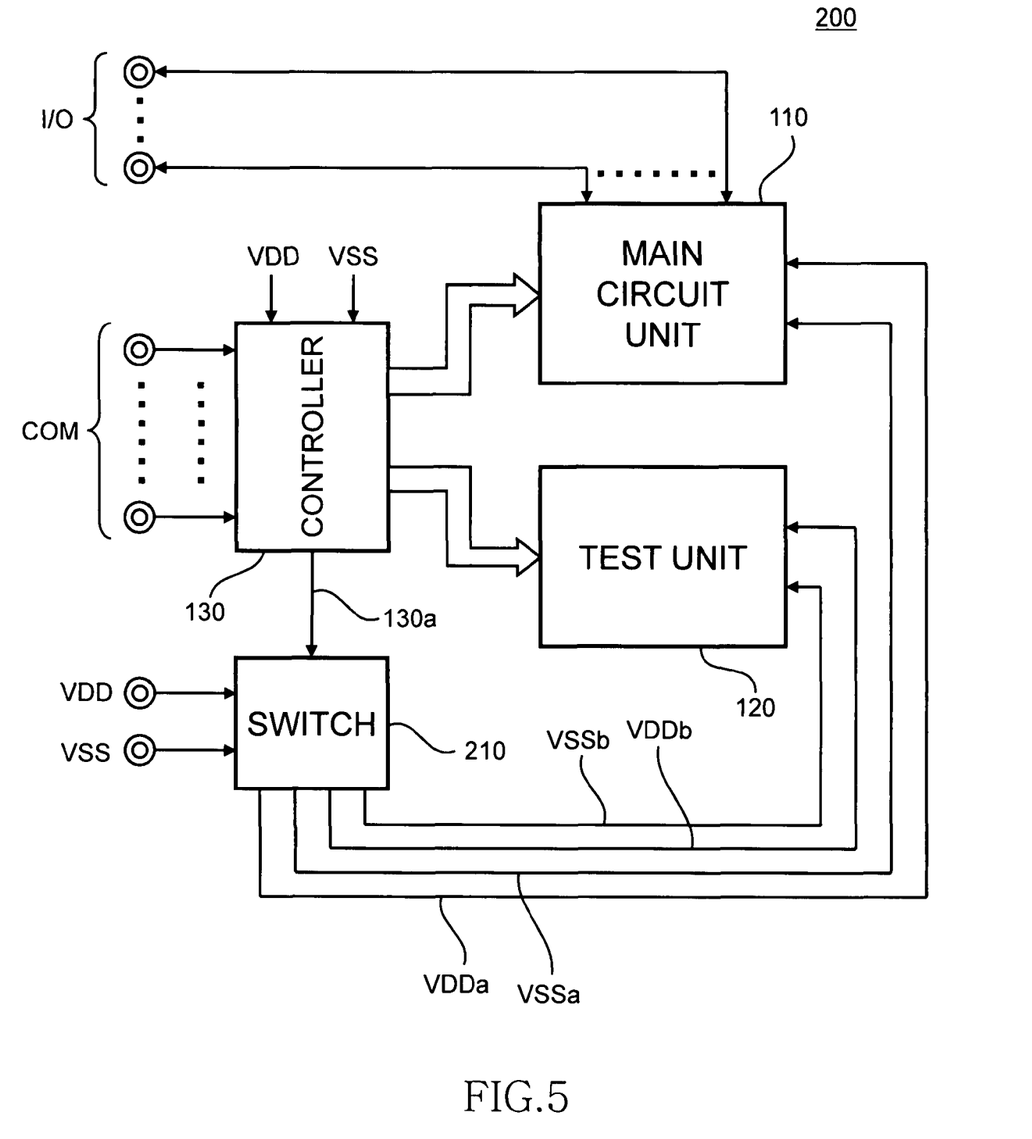
FIG. 5 is a block diagram showing a configuration of a semiconductor device according to a second embodiment of the present invention.

FIG. 5 is a block diagram showing a configuration of a semiconductor device 200 according to a second embodiment of the present invention.

As shown in FIG. 5, the semiconductor device 200 according to the present embodiment differs from the semiconductor device 100 in the first embodiment in that a switch 210 is provided for supplying power to the main circuit unit 110 and the test unit 120. Other parts are the same as those of the semiconductor device 100 and therefore like reference numerals are given to like elements, and redundant explanations thereof will be omitted.

The switch 210 is controlled by a switching signal 130*a* supplied from the controller 130. To explain specifically, the switching signal 130*a* is in a deactivated state during the normal operation and, in this case, the power supply potential VDD and the ground potential VSS supplied from outside are supplied to the main circuit unit 110 via a power supply line VDDa and a ground line VSSa, respectively. Accordingly, during the normal operation, the power supply voltage is supplied correctly to the main circuit unit 110. At this time, no voltage is supplied to the test unit 120 via a power supply line VDDb and a ground line VSSb. Because of this, the power consumption of the test unit 120 during the normal operation is substantially zero, including a leak.

On the other hand, when the test mode is entered, the switching signal 130*a* is activated. Accordingly, the power supply potential VDD and the ground potential VSS provided from outside are supplied to the test unit 120 via the power supply line VDDb and the ground line VSSb, respectively, by the switch 210. Due to this, when the test mode is entered, the power supply voltage is supplied to the test unit 120 correctly, and it is possible to make the characteristic measurement of the element to be measured correctly. At this time, no voltage is supplied to the main circuit unit 110 via the power supply line VDDa and the ground line VSSa and because of this, the power consumption of the main circuit unit 110 during test is substantially zero.

As described above, in the present embodiment, when the test mode is entered, power supply to the main circuit unit 110 is stopped and therefore it is possible to accurately measure the amount of a current that flows through the element to be measured as in the first embodiment. In addition, in the second embodiment, the power consumption of the main circuit unit 110 during the test is substantially zero and therefore the measurement in step S12 (the initial current I0) shown in FIG. 3 can be omitted. In this case, however, since the power consumed by the controller 130 cannot be cancelled out, it is preferable to set the power consumption of the test unit 120 larger so that the power consumption by the controller 130 can be ignored.

The present invention is in no way limited to the aforementioned embodiments, but rather various modifications are possible within the scope of the invention as recited in the claims, and naturally these modifications are included within the scope of the invention.

For example, in the above embodiment, as explained using FIG. 3, the difference between the respective current values (=I0+In) obtained in step S14 and the current value (=I0) obtained in step S12 is calculated (step S16), while the measured current values can be stored in the database 199 as they are without performing such an operation. In this case, a user who uses the database 199 performs the above operation.

In the above embodiment, a transistor is used as an element to be measured, while the kind of the element to be measured is not limited to this, and the element can be a resistor or a capacitor.

In addition, the kind of the semiconductor device, which is aimed by the present invention, is not limited in particular and the present invention can be applied to various types of semiconductor devices, such as a memory and a processor.

What is claimed is:

1. A semiconductor device, comprising:
a single semiconductor substrate;
a main circuit unit on said substrate;
a test unit, on said substrate, that includes at least one element to be measured;
a controller, on said substrate, that energizes the element to be measured in a state in which power consumption of the main circuit unit is kept substantially at zero or almost constant; and
a switch controlled by the controller, the switch selectively supplying power to the test unit and the main circuit unit, wherein the controller keeps the power consumption of the test unit substantially at zero by stopping power supply to the test unit during operation of the main circuit unit, and wherein the controller keeps the power consumption of the main circuit unit substantially at zero by stopping power supply to the main circuit unit during operation of the test unit.

2. The semiconductor device as claimed in claim 1, wherein the test unit includes a plurality of elements to be measured, and the controller can selectively energizes the plurality of elements to be measured.

3. The semiconductor device as claimed in claim 2, wherein the plurality of elements to be measured are transistors of different kinds from each other.

4. The semiconductor device as claimed in claim 1, wherein the controller keeps the power consumption of the main circuit unit almost constant by bringing the main circuit unit into a standby state.

5. The semiconductor device of claim 1, further comprising a common power supply terminal that supplies power to each of the main circuit unit, the test unit, and the controller.

6. A semiconductor device, comprising:
on a single semiconductor substrate,
a plurality of chip pads that receive a test command from a tester,
a voltage supply pad that is supplied with an operation voltage,
a main circuit unit,
a test unit that includes at least one element to be measured, and
a controller between the chip pads and the main circuit and the test unit, the controller controlling the main circuit unit and the test unit to be in a first condition wherein the main circuit is deactivated and the test unit is activated after being in a second condition wherein the main circuit unit and the test unit are deactivated, while the main circuit unit and the test unit are supplied with the operation voltage in response to the test command,
wherein a first power supply current and a second power supply current that flow through the semiconductor device are measured under the first condition and the second condition, respectively, and a difference between the first power supply current and the second power supply current is calculated as a power supply current of the test unit.

* * * * *